US012795865B2

(12) United States Patent
Costakis et al.

(10) Patent No.: US 12,795,865 B2
(45) Date of Patent: Nov. 10, 2026

(54) MODULAR AIR COOLING AND DISTRIBUTION SYSTEMS AND METHODS

(71) Applicant: Inertech IP LLC, Plano, TX (US)

(72) Inventors: John Costakis, Glasco, NY (US); Ken Nguyen, Danbury, CT (US); Ming Zhang, Weston, CT (US); Doron Shapiro, St. Louis, MO (US)

(73) Assignee: INERTECH IP LLC, Plano, TX (US)

( * ) Notice: Subject to any disclaimer, the term of this patent is extended or adjusted under 35 U.S.C. 154(b) by 0 days.

(21) Appl. No.: 16/741,493

(22) Filed: Jan. 13, 2020

(65) Prior Publication Data

US 2020/0229323 A1 Jul. 16, 2020

Related U.S. Application Data

(63) Continuation of application No. PCT/US2018/042353, filed on Jul. 16, 2018.

(Continued)

(51) Int. Cl.
*H05K 7/20* (2006.01)

(52) U.S. Cl.
CPC ..... *H05K 7/20836* (2013.01); *H05K 7/20145* (2013.01); *H05K 7/20745* (2013.01)

(58) Field of Classification Search
CPC ........... H05K 7/20836; H05K 7/20145; H05K 7/20745; H05K 7/20736; H05K 7/20827;

(Continued)

(56) References Cited

U.S. PATENT DOCUMENTS 7,856,838 B2 * 12/2010 Hillis .................... H01L 23/467 62/259.2
8,523,643 B1 * 9/2013 Roy .................... H05K 5/0213 454/184

(Continued)

FOREIGN PATENT DOCUMENTS

EP 0741269 A2 11/1996
JP H03502130 A 5/1991

(Continued)

OTHER PUBLICATIONS

Examination report issued in Australian Patent Application No. 2018301734 dated Apr. 21, 2022.

(Continued)

*Primary Examiner* — Michael G Hoang
*Assistant Examiner* — Brett P. Mallon
(74) *Attorney, Agent, or Firm* — Weber Rosselli & Cannon LLP

(57) ABSTRACT

Modular air cooling and distribution systems include a fan and heat exchanger cooling assembly and a controller which controls the fan speed based on temperature and velocity measurements. The cooling assembly includes a fluid-to-air heat exchanger and a variable speed fan. The fluid in the fluid-to-air heat exchanger may be propylene glycol or water. The heat exchanger minimizes pressure drop and maximizes heat transfer. The quantity of cooling assemblies is selected to match the indoor cooling requirements. The cooling assemblies are easily assembled together, stacked vertically, and/or connected horizontally, to match the cooling load. If additional cooling capacity is needed in the future, more cooling assemblies can easily be added, and the cooling assemblies may be expanded vertically and/or horizontally. The speed of the fans of the fan and heat exchanger assemblies are controlled based on fluid temperature and (Continued)

fluid velocity measurements, which may be obtained by an anemometer.

19 Claims, 16 Drawing Sheets

Related U.S. Application Data

(60) Provisional application No. 62/532,680, filed on Jul. 14, 2017.

(58) Field of Classification Search
CPC ........... H05K 7/20209; H05K 7/20136; H05K 7/20172
USPC .......................................................... 454/184
See application file for complete search history.

(56) References Cited

U.S. PATENT DOCUMENTS

| | | | | |
|---|---|---|---|---|
| 9,101,080 | B2 | 8/2015 | Czamara et al. | |
| 9,445,531 | B1 | 9/2016 | Heydari | |
| 9,510,485 | B2 | 11/2016 | Schmitt et al. | |
| 9,572,288 | B2 | 2/2017 | Wilcox et al. | |
| 9,693,486 | B1 | 6/2017 | Roy | |
| 10,244,664 | B2 | 3/2019 | Bean, Jr. | |
| 10,271,462 | B1 | 4/2019 | Ross et al. | |
| 2008/0055850 | A1 | 3/2008 | Carlson et al. | |
| 2008/0306635 | A1 * | 12/2008 | Rozzi | G06F 1/206 361/679.48 |
| 2009/0046427 | A1 | 2/2009 | Noteboom et al. | |
| 2010/0144265 | A1 | 6/2010 | Bednarcik et al. | |
| 2010/0170277 | A1 | 7/2010 | Schmitt et al. | |
| 2012/0155027 | A1 * | 6/2012 | Broome | H05K 7/2039 361/688 |
| 2013/0199032 | A1 * | 8/2013 | Czamara | H05K 7/1497 29/428 |
| 2013/0213071 | A1 * | 8/2013 | Takahashi | F24F 12/006 165/185 |
| 2013/0244563 | A1 * | 9/2013 | Noteboom | H05K 7/20836 454/250 |
| 2015/0053020 | A1 * | 2/2015 | Cobo | G06F 1/183 73/861.75 |
| 2015/0181769 | A1 * | 6/2015 | Oki | H05K 7/20718 165/121 |
| 2015/0234397 | A1 * | 8/2015 | VanGilder | G06F 30/20 703/2 |
| 2016/0021792 | A1 | 1/2016 | Minegishi et al. | |
| 2017/0122580 | A1 | 5/2017 | Karamanos et al. | |
| 2018/0376612 | A1 * | 12/2018 | Ortenzi | H05K 7/20781 |

FOREIGN PATENT DOCUMENTS

| | | | |
|---|---|---|---|
| JP | H08303815 | A | 11/1996 |
| JP | 2009275994 | A | 11/2009 |
| JP | 2010079919 | A | 4/2010 |
| JP | 2013506224 | A | 2/2013 |
| JP | 2014089695 | A | 5/2014 |
| JP | 2014156981 | A | 8/2014 |
| JP | 2014214948 | A | 11/2014 |
| JP | 2015046176 | A | 3/2015 |
| JP | 2016024562 | A | 2/2016 |
| JP | 2016196980 | A | 11/2016 |
| WO | 2011038348 | A1 | 3/2011 |
| WO | 2011053992 | A2 | 5/2011 |
| WO | 2013066174 | A1 | 5/2013 |
| WO | 2013114528 | A1 | 8/2013 |
| WO | 2014068767 | A1 | 5/2014 |

OTHER PUBLICATIONS

Communication pursuant to Article 94(3) EPC issued in European Patent Application No. 18749965.2 dated Feb. 2, 2022.
Notice of Reasons for Refusal issued in Japanese Patent Application No. JP 2020-501535 dated Aug. 16, 2022 with English translation.
Korean Office Action issued in Korean Patent Application No. 10-2020-7004277 dated Feb. 21, 2023 with English translation.
Japanese Office Action issued in Japanese Patent Application No. 2020-501535 dated Jun. 13, 2023, with English translation.
Notice of Final Rejection issued in Korean Patent Application No. 10-2020-7004277 dated Dec. 26, 2023 with English translation.
Examination report No. 1 issued in Australian Patent Application No. 2023202362 dated Apr. 29, 2024.
Canadian Office Action issued in Canadian Patent Application No. 3,072,888 dated Nov. 11, 2024.
Notice of Reasons for Refusal issued in Japanese Patent Application No. 2020-501535 dated Mar. 18, 2025 with English translation.
Notice of Reasons for Refusal issued in JP Application No. 2020-501535 dated Jan. 6, 2026 with English translation.
Notice of Reasons for Refusal issued in JP Application No. 2024-088070 dated Dec. 23, 2025 with English translation.
Request for the Submission of an Opinion issued in Korean Patent Application No. 10-2024-7038963 dated Jan. 26, 2026 with English translation.
Extended European Search Report issued in EP Application No. 25151783.5 dated Oct. 22, 2025.

* cited by examiner

MODULAR AIR COOLING AND DISTRIBUTION SYSTEMS AND METHODS

BACKGROUND

Data center server racks contain a large amount of electronics, which generate large quantities of heat. Consequently, a large amount of power is needed to cool the electronics. A contributing factor to the large power consumption is how cooling fluid or air is provided to the server racks.

SUMMARY

In one aspect, this disclosure features a cooling system. The cooling system includes a ceiling plenum formed between a first ceiling and a second ceiling of a building, and a containment assembly disposed above at least one hot aisle formed by rows of server racks and extending through an aperture in the first ceiling. The containment assembly directs fluid from the hot aisle into the ceiling plenum. The cooling system includes a fluid velocity sensor that measures velocity of fluid flowing in the hot aisle or the containment assembly and a temperature sensor that measures the temperature of the fluid flowing in the hot aisle or the containment assembly. The cooling system includes at least one fan and heat exchanger assembly and a controller that adjusts a speed of at least one fan of the at least one fan and heat exchanger assembly based on the measured temperature and velocity. The at least one fan of the at least one fan and heat exchanger assembly causes fluid to flow from the ceiling plenum, through at least one heat exchanger of the at least one fan and heat exchanger assembly, and to the plurality of server racks.

In aspects, the at least one fan and heat exchanger assembly includes a first row of fan and heat exchanger assemblies and a second row of fan and heat exchanger assemblies adjacent to the first row of the fan and heat exchanger assemblies.

In aspects, the velocity sensor and the temperature sensor is implemented by an anemometer.

In aspects, the cooling system includes a redundant anemometer.

In aspects, the at least one fan and heat exchanger assembly is disposed inside an outdoor enclosure outside of the building and adjacent to a wall of the building, and the at least one fan causes fluid to flow through an aperture in the wall to the server racks.

In aspects, the cooling system includes a floor plenum formed between a floor and a slab of the building, and an air duct fluidly coupled between the ceiling plenum and the floor plenum. The at least one fan and heat exchanger assembly is disposed within the air duct and causes air to flow through the air duct to the floor plenum and through apertures in the floor to the server racks.

In aspects, the cooling system includes an interior wall disposed within the building between the server racks and the at least one fan and heat exchanger assembly and extending from a floor of the building so as to connect with the first ceiling and form an interior wall aperture between the second ceiling and a top portion of the interior wall.

In aspects, the heat exchangers are disposed between the interior wall and the fans, and the fans are configured to cause air to flow from the server racks, through the interior wall aperture, to the ceiling plenum, and through the containment assembly.

In aspects, fans are disposed between the interior wall and heat exchangers, and the fans cause air to flow from the ceiling plenum, through the interior wall aperture, and to the server racks via the fan and heat exchanger assemblies.

In aspects, the at least one fan and heat exchanger assembly includes a fan and heat exchanger assembly enclosure.

In yet another aspect, this disclosure features another cooling system. The cooling system includes a first containment assembly disposed within a building and disposed adjacent to at least one hot aisle formed by rows of server racks, a fluid velocity sensor that measures velocity of fluid flowing in the first containment assembly, a temperature sensor that measures the temperature of the fluid flowing in the first containment assembly, a first row of fan and heat exchanger assemblies disposed outside of the building, a second row of fan and heat exchanger assemblies disposed outside of the building and disposed adjacent to the first row of fan and heat exchanger assemblies, and a controller that adjusts a speed of fans of the first and second rows of the fan and heat exchanger assemblies based on the measured temperature and velocity. Fans of the fan and heat exchanger assemblies cause air to flow from the hot aisle, through the first containment assembly, through heat exchangers of the fan and heat exchanger assemblies, and to the server racks.

In aspects, the first containment assembly is disposed between a side of the hot aisle and at least one aperture in an exterior wall of the building, and the first and second rows of the fan and heat exchanger assemblies are in fluid communication with the first containment assembly via the at least one aperture in the exterior wall.

In aspects, the first containment assembly is disposed above the hot aisle.

In aspects, the cooling system includes a second containment assembly disposed above the first containment assembly.

In aspects, the cooling system includes a fan and heat exchanger enclosure housing the fan and heat exchanger assemblies.

In yet another aspect, this disclosure features yet another cooling system. The cooling system includes a first containment assembly disposed within a building and disposed adjacent to at least one hot aisle formed by rows of server racks, a fluid velocity sensor that measures velocity of fluid flowing in the containment assembly, a temperature sensor that measures the temperature of the fluid flowing in the containment assembly, first and second rows of fan and heat exchanger assemblies disposed within the building at a height above the height of the server racks; and a controller that adjusts a speed of fans of the first and second rows of the fan and heat exchanger assemblies based on the measured temperature and velocity. Fans of the fan and heat exchanger assemblies cause air to flow from the hot aisle, through the first containment assembly, through heat exchangers of the fan and heat exchanger assemblies, and to the server racks.

In aspects, the first containment assembly is disposed to a side of the hot aisle, and the fan and heat exchanger assemblies are disposed above and in fluid communication with the first containment assembly.

In aspects, the cooling system includes a second containment assembly disposed above the first containment assembly, and the fan and heat exchanger assemblies are coupled to and in fluid communication with the second containment assembly.

In yet another aspect, this disclosure features a method of cooling server racks. The method includes sensing a fluid temperature in or near at least one hot aisle defined between rows of server racks; if the fluid temperature is greater than a predetermined fluid temperature, increasing, by a predetermined speed, a speed of at least one fan circulating fluid through the server rack, the hot aisle, and a heat exchanger; if the fluid temperature is less than the predetermined fluid temperature, measuring fluid velocity and determining whether the fluid velocity is greater than a predetermined velocity; and if the measured fluid velocity is greater than the predetermined velocity, decreasing the speed of the fans by another predetermined speed.

In aspects, the fluid temperature and the fluid velocity are measured within a containment assembly disposed adjacent to the hot aisle.

In aspects, the fluid temperature and the fluid velocity are measured by an anemometer.

BRIEF DESCRIPTION OF THE DRAWINGS

One or more aspects of this disclosure are particularly pointed out and distinctly claimed as examples in the claims at the conclusion of the specification. The foregoing and other objects, features, and advantages of this disclosure may be more readily understood by one skilled in the art with reference being had to the following detailed description of several embodiments thereof, taken in conjunction with the accompanying drawings wherein like elements are designated by identical reference numerals throughout the several views, and in which:

The figures depict embodiments of this disclosure for purposes of illustration only. One skilled in the art will readily recognize from the following description that alternative embodiments of the structures and methods illustrated herein may be employed without departing from the principles of this disclosure described herein.

DETAILED DESCRIPTION

The modular air cooling and distribution systems of this disclosure allow for great flexibility, scalability, ease of installation, and reduced energy consumption for cooling of large, open, indoor areas such as data centers. Combinations of a basic fan/heat exchanger modular assembly may be configured in many ways to best accommodate a given building's overall design.

Embodiments of this disclosure relate to an easy-to-install, low-cost, low-air-pressure-drop, and modular air cooling and distribution system to direct the hot air from the server racks to the heat exchangers. The hot air is then cooled by a liquid, e.g., a refrigerant or chilled water, and cool air is discharged back to open space of the data center. In embodiments, high temperature air from the servers is separated from cooling air all the way to the inlet of heat exchangers by using ceiling or hot aisle containment and short ducts (when needed). By keeping hot air isolated, heat rejection can be done at higher temperatures, thus leading to more "free" cooling, lower liquid flow rate, and higher energy efficiency. The heat exchangers, as disclosed in Provisional Patent Application No. 62/380,039, the entire contents of which are incorporated by reference herein, are multi-row-flat-aluminum-tube heat exchangers with low air pressure drop. This factor, combined with the low air pressure drop through the containment/ceiling/plenum, results in low overall pressure drop and fan power. Analysis shows that some embodiments have uniform air temperature distribution across the data center.

While this disclosure uses the term "air", other fluids in the gaseous state may be used in place of air according to embodiments of this disclosure.

FIGS. 1 through 10 show various embodiments in which fan and heat exchanger assemblies and airflow arrangement can be applied to fit the details of a given building's structure.

Figure 1:
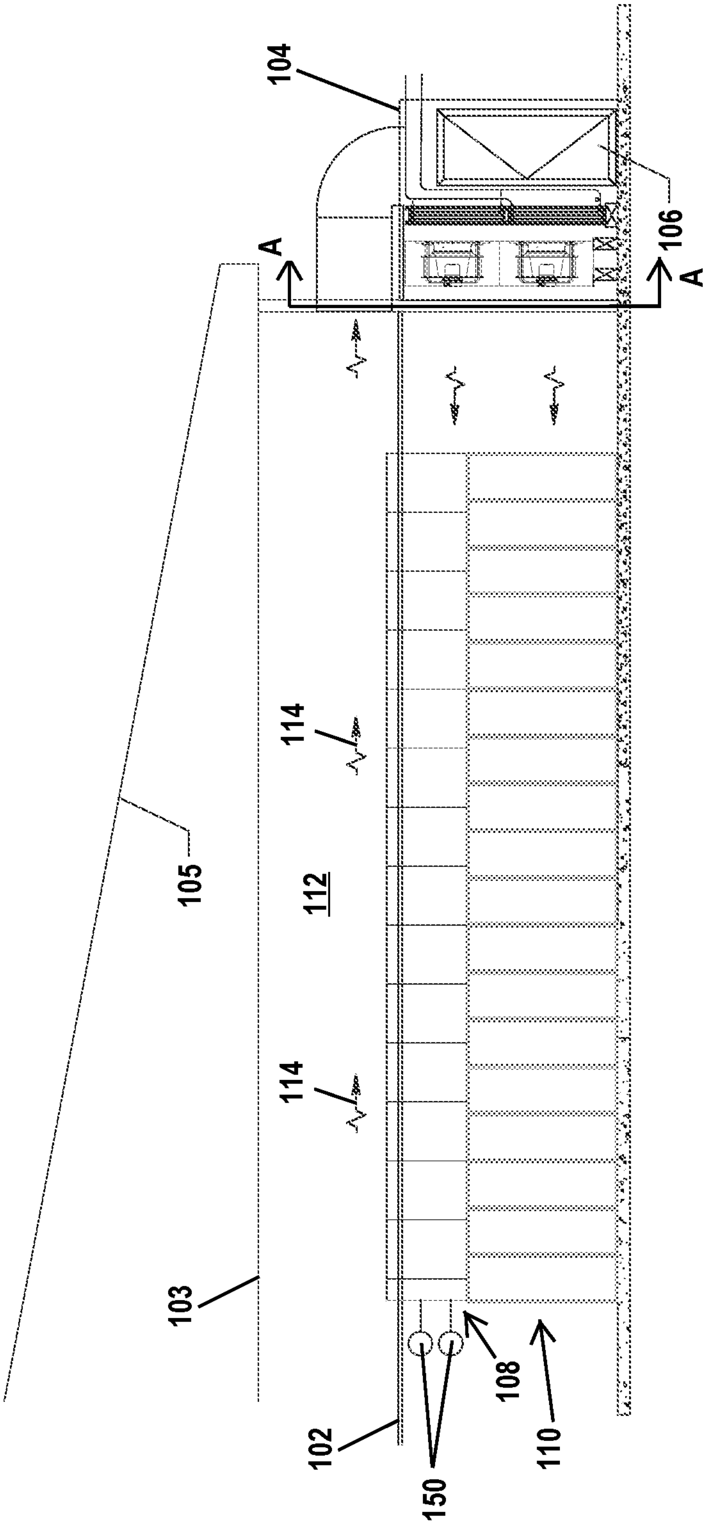
FIG. 1 is an elevation view of a data center assembly with a relatively low ceiling height according to an embodiment of this disclosure.

FIG. 1 shows an embodiment with a lower ceiling 102 having a relatively low height. The cooling units or modules 104 are located outside and do not require any indoor floor space. The outdoor cooling modules assemblies 104 may be assembled at a factory and mounted on a modular slab. The cooling modules or assemblies 104 may be disposed within a weather-proofed enclosure. A containment assembly 108 is coupled to the server racks 110 to contain a hot aisle. A ceiling plenum 112 may be defined between the lower ceiling 102 and an upper ceiling 103. Alternatively, the upper ceiling 103 may be removed and the ceiling plenum 112 may be defined between the lower ceiling 102 and a pitched roof 105. The ceiling plenum 112 is configured to supply return air 114 to the cooling modules or assemblies 104.

Redundant anemometers 150 are coupled to the containment assembly 108 so as to measure the temperature and/or velocity of the air flowing through the containment assembly 108. In other embodiments, another type of fluid velocity sensor and fluid temperature sensor may be used in place of the redundant anemometers 150. For example, the fluid temperature sensor may be replaced by a paddle attached to a mechanical switch so that the fluid flow in the containment assembly 108 causes the paddle to move the mechanical switch back and forth and thus sense the direction of fluid flow. The fluid flow direction may alternatively be measured by any other fluid flow direction sensor known in the art. The fluid velocity sensor may be any suitable low velocity-type sensor.

The temperature and/or velocity measurements are used to control the speed of one or more of the fans 121 of the fan and heat exchanger assemblies. For example, the fluid velocity and temperature measurements, which indicate the leakage rate of fluid between the hot aisle to the cold aisle, may be used to modulate the speed of the fans 121 of the fan and heat exchanger assembly to neutralize the pressure inside the containment assembly. In embodiments, the anemometers 150 may be hot wire anemometers capable of sensing both air temperature and velocity simultaneously.

In embodiments, the control system may use a temperature set point and a velocity set point. For example, the temperature set point may be calculated according to the following equation:

Temp. set point=hot aisle temp.−((hot aisle temp.−cold aisle set temp)/3).

The temperature set point is used to command the fans of the fan and heat exchanger assemblies to accelerate or decelerate. The velocity set point may be used to fine tune the fan speed to minimize the air leakage. For example, the velocity set point may be used to decelerate the fan speed.

The control system may operate in a manual mode and an automatic mode. In the manual mode, the fans are set at a fixed speed, which overrides the automatic settings. For example, the initial velocity set point may be set to a predetermined velocity, e.g., 150 ft/min. In the automatic mode, when a low load is applied, the control system may first determine whether the hot aisle and cold aisle set temperature is less than, for example, a predetermined temperature, e.g., 5° F. If the hot aisle and cold aisle set temperature is less than 5° F., the fan speed is maintained at a minimum speed, which may be a predetermined minimum speed. If the calculated total IT load divided by the total number of active fan and heat exchanger assemblies is less than a predetermined percentage (e.g., 30%) or if the temperature differential between the inlet and discharge temperature of the fan and heat exchanger assemblies is less than a predetermined temperature (e.g., 10° F.), the fan speed may be calculated according to the following example equation:

% of Full Fan Speed=IT Load×130/Fan & Heat Exchanger Assembly Max Air Volume×100

If the calculated total IT load divided by the total number of active fan and heat exchanger assemblies is more than a predetermined percentage (e.g., 30%) and the temperature differential between the inlet and discharge temperature of the fan and heat exchanger assemblies is more than a predetermined temperature (e.g., 10° F.), the percentage of full fan speed may be determined as follows. If the reading from the anemometer is higher than a temperature set point (e.g., 10° F.), the fan speed is increased by a predetermined number of rotations per minute (RPM) (e.g., 100 RPM). The fan speed continues to increase until the sensed temperature is less than the temperature set point. If the temperature reading from the anemometer is lower than the temperature set point and the velocity reading from the anemometer is higher than the velocity set point (e.g., 150 ft/min), the fan speed is decreased (e.g., the fan speed is decreased by 100 RPM or a PID controller for controlling the velocity is applied based on the anemometer's readings).

If the temperature reading from anemometer is lower than the temperature set point and the velocity reading from the anemometer is lower than the velocity set point, which may depend on, for example, the site conditions (e.g., 75 ft/min or 150 ft/min), the fan speed is not changed. In some embodiments, if the anemometer measurement is unstable for either temperature or velocity, the controller may apply the average measurement over time (e.g., over 3-5 seconds) instead of the instantaneous measurement.

Figure 2:
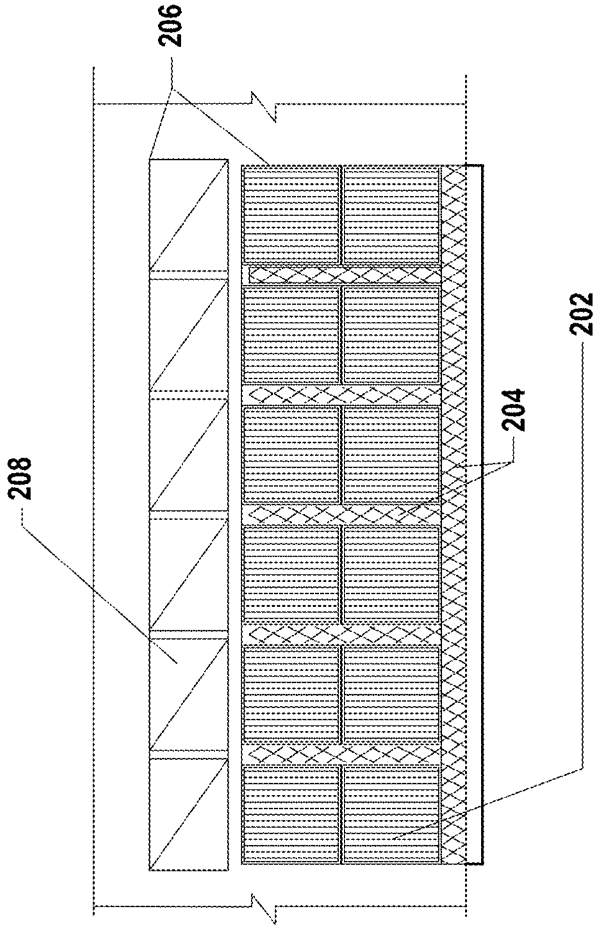
FIG. 2 is a cross-sectional front view of the cooling assembly of FIG. 1 taken across section A-A.

FIG. 2 shows a cross-sectional view of an optional modular air wall section taken across section A-A in accordance with one example embodiment. The modular air wall section includes twelve guard or louvre sections 202 corresponding to twelve fan and heat exchanger modules or assemblies arranged two high and six across. In other words, the guard or louvre sections 202 correspond to two rows of fan and heat exchanger assemblies, each having six fan and heat exchanger assemblies. In embodiments, there may be any number of rows of fan and heat exchanger assemblies depending on the capacity requirements and/or configuration of the data center. For example, there may be three rows of fan and heat exchanger assemblies or there may be seven rows of fan and heat exchanger assemblies. Each of the guard or louvre sections 202 may include fluid deflectors to direct fluid flow or diffuse fluid at an angle. The angle of the fluid deflectors may be adjustable.

Mechanical and electrical chases 204 are disposed between the guard or louvre sections 202 and may be disposed between the fans and/or heat exchangers of the fan and heat exchanger assemblies. Wall openings or apertures 206 are formed to receive the return air conduits 208 and the guard or louvre sections 202. In embodiments, the return air conduits 208 may be combined into a single or common return air conduit that feeds into the plenum room 106. The modular air wall section also includes removable return air conduits 208 which may be removed to receive additional fluid ducts to carry more return air from the ceiling plenum 112 into the plenum room 106 as further cooling capacity is needed.

Figure 3:
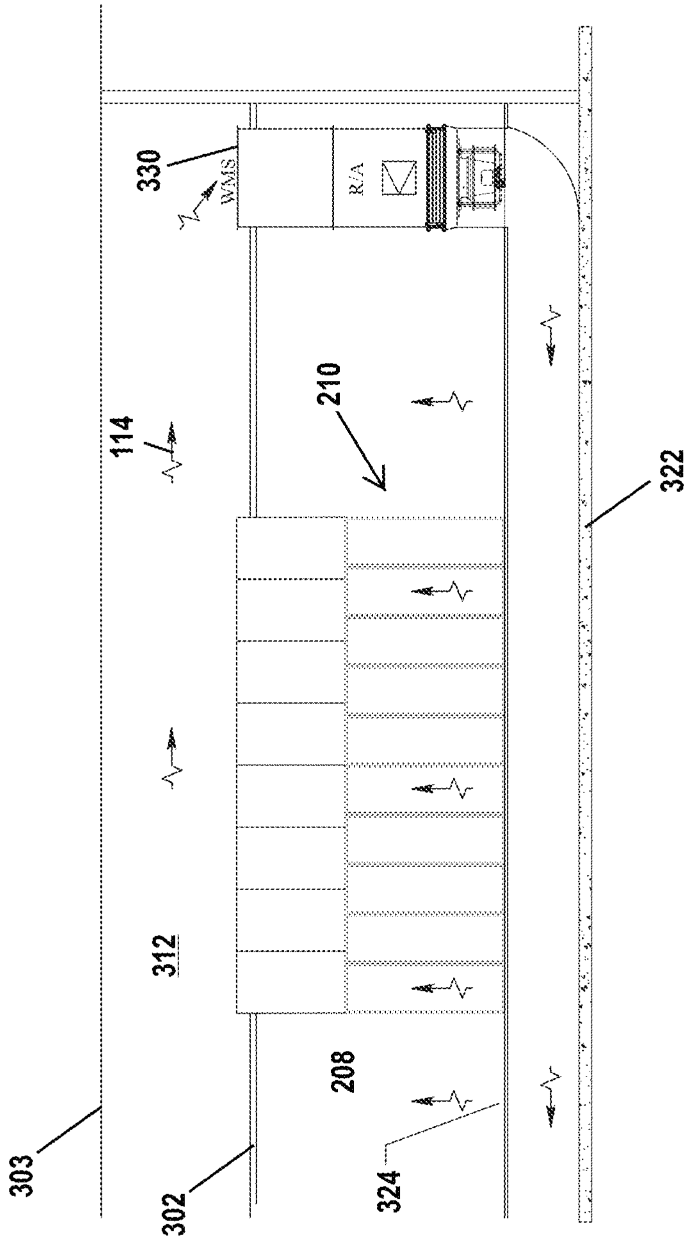
FIG. 3 is an elevation view of a data center assembly with under-floor cool air distribution according to another embodiment.

FIG. 3 shows an embodiment of an example data center assembly with under-floor cool air distribution. Return air 214 is circulated through a ceiling plenum 312 between a ceiling 302 and a roof 303, through a fan and heat exchanger assembly having a wire mesh screen 330, through a volume formed between a slab 322 and perforated floor tiles 324, and then through the server racks 210.

Figure 4:
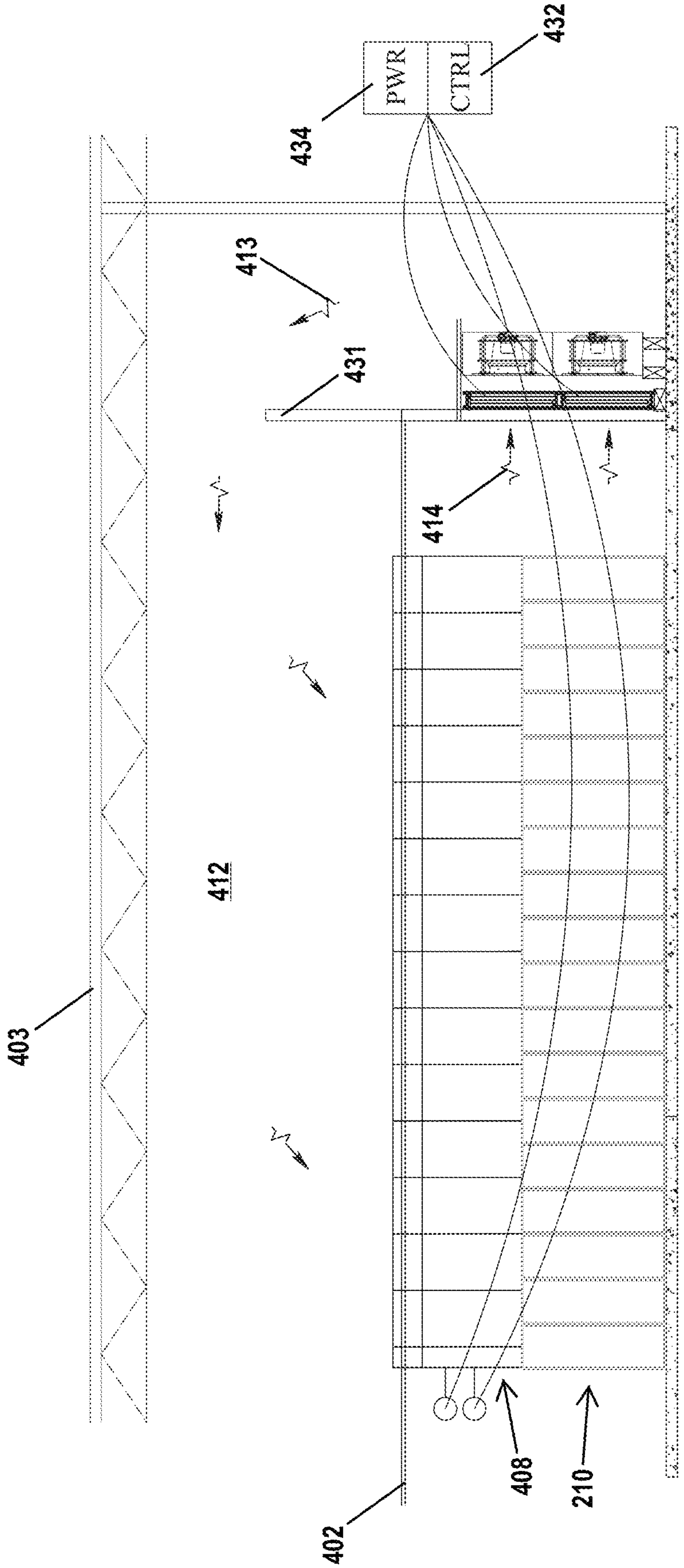
FIG. 4 is an elevation view of a data center assembly with a relatively high ceilings according to yet another embodiment of this disclosure.

FIG. 4 shows an embodiment of an example data center assembly in a cold aisle containment configuration with a relatively high ceiling 403, which may correspond to another floor of a multi-level building. In embodiments, the high ceiling 403 may be formed of concrete T-beams, which may form a portion of the ceiling plenum 412. In embodiments, the high ceiling 403 may be constructed so that the high ceiling 403 is closer to the low ceiling 402. A vertical baffle 431 separates warm return air 414 from cool supply air 413. The fan discharge air flow is reversed and cool air 413 is distributed in front of the server racks 210 via the containment assembly 408, which contains the cold aisle formed by the server racks 210. Also, warm air 414 is drawn out of the one or more hot aisles of the server racks 210 by the fans of the fan and heat exchanger assemblies. A control module 432 and a power module 434 are coupled to the anemometers 150 in fluid communication with the fluid flowing in the containment assembly 408 and the fan and heat exchanger assemblies to provide control signals and power, respectively, to the containment assembly 408 and the fan and heat exchanger assemblies, e.g., control signals to control the speed of variable speed fans of the fan and heat exchanger assemblies. The control module 431 may be implemented by any suitable controller, which may include a processor and memory, for executing the methods disclosed herein including methods that use fluid temperature and velocity measurements.

Figure 5:
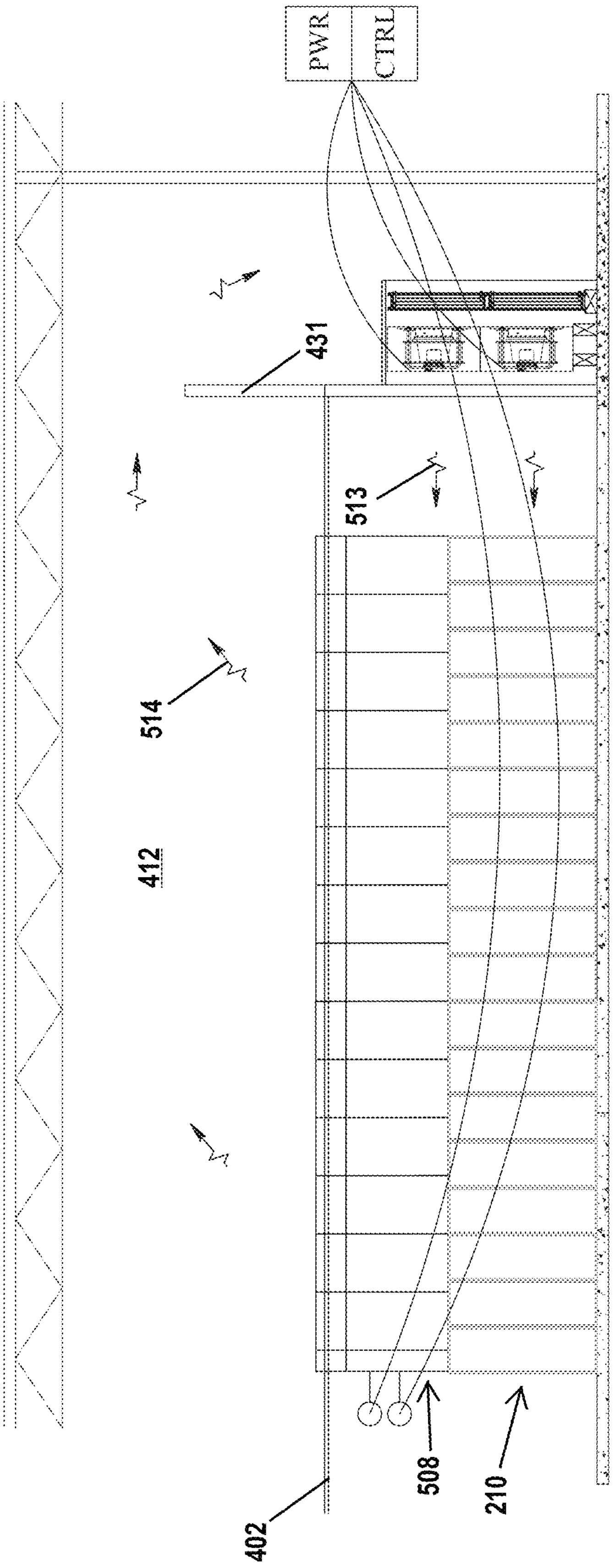
FIG. 5 is an elevation view of a data center assembly where a vertical baffle is used to separate warm overhead return air from cool supply air according to yet another embodiment of this disclosure.

FIG. 5 shows an embodiment of an example data center assembly in a hot aisle containment configuration where the vertical baffle 431 is used to separate warm overhead return air 514 from cool supply air 513. The direction of the fan discharge air flow (cool supply air 513) is opposite the direction of the fan discharge air flow (warm return air 414) of FIG. 4. The fans of the fan and heat exchanger assemblies distribute the cool supply air 513 in front of the server racks 210. Also, the warm return air 514 flows out of the containment assembly 508.

Figure 6:
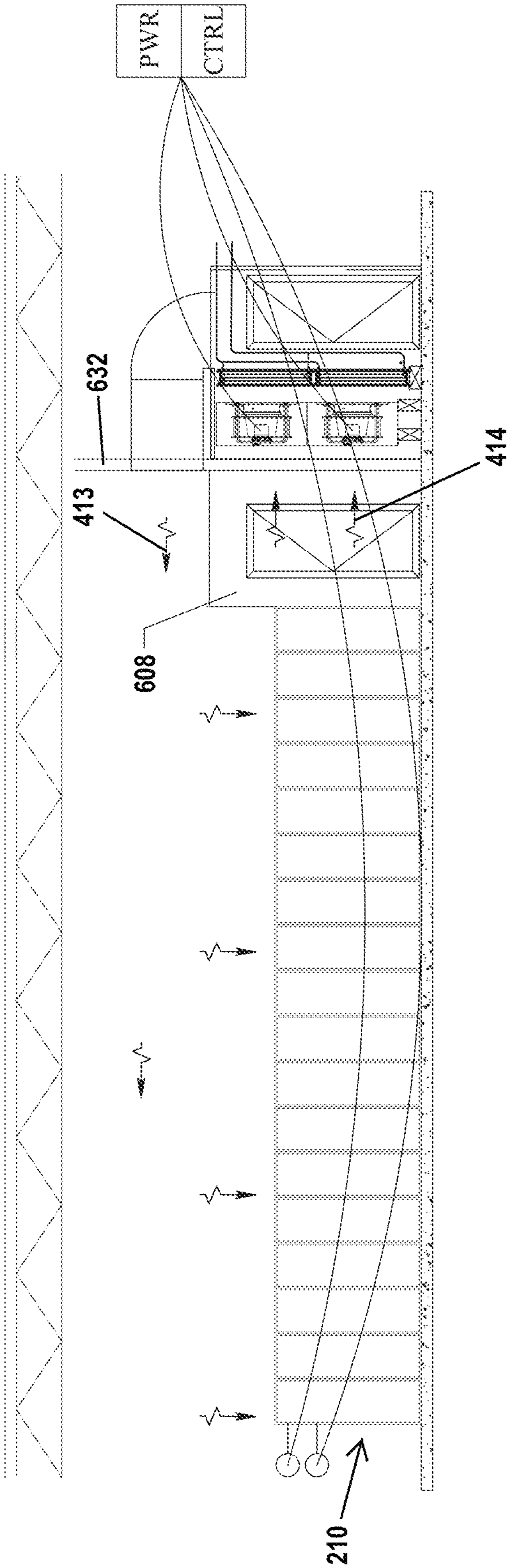
FIG. 6 is an elevation view of a data center assembly showing air from the hot aisle being drawn into the cooling modules at ground level according to yet another embodiment of this disclosure.

FIG. 6 shows an embodiment of a cooling system in which warm return air 414 from the hot aisle of the server racks 210 is drawn into the outside fan and heat exchanger assemblies at ground level. Cool supply air 413 is supplied to the front of the server racks 210 from overhead. The one or more hot aisles between the server racks 210 are enclosed at the height or top of the server racks 210 by a cover and a hot air containment assembly 608 is disposed between the right-most server rack of the server racks 210 and a wall or panel 632 of the building or facility. The hot air containment assembly 608 is in air flow communication with the outside fan and heat exchanger assemblies.

Figure 7:
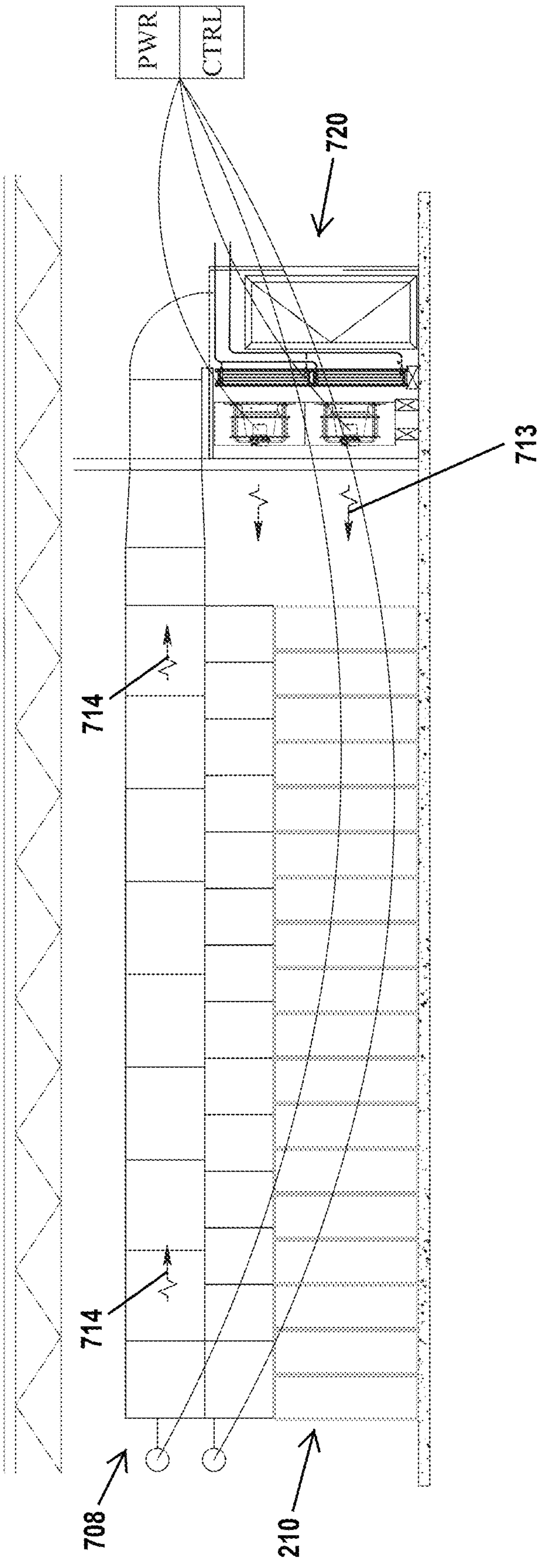
FIG. 7 is an elevation view of a data center assembly showing a technique where cool air is blown in front of server racks according to yet another embodiment of this disclosure.

FIG. 7 shows an embodiment of a cooling system in which cool supply air 713 is blown in front of the server racks 210. An overhead hot aisle containment assembly is used to draw warm return air 714 from the server racks 210 to the inlet of the fan and heat exchanger assemblies 720.

Figure 8:
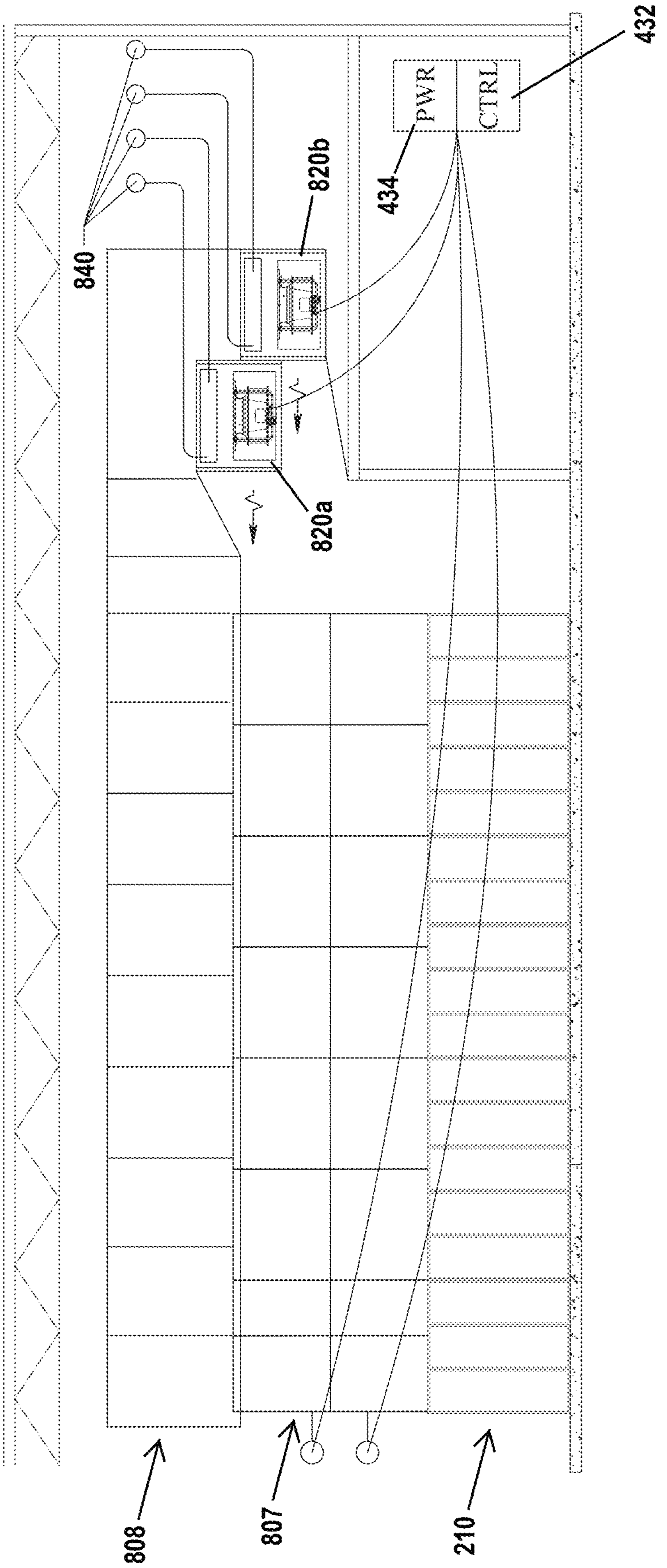
FIG. 8 is an elevation view of a data center assembly with cooling modules mounted overhead according to yet another embodiment of this disclosure.

FIG. 8 shows an embodiment of a cooling system with the fan and heat exchanger assemblies 820*a*, 820*b* mounted overhead. The cooling system of FIG. 8 includes a first air containment assembly 807 and a second air containment assembly 808 disposed on the first air containment assembly 807. The fan and heat exchanger assemblies 820*a*, 820*b* are coupled in a tiered configuration to the underside of a right-most portion of the second air containment assembly 808 and are in air flow communication with the second air containment assembly 808. The heat exchangers of the fan and heat exchanger assemblies 820*a*, 820*b* are coupled to chilled water supply and return piping 840 to receive and return chilled water from and to a water cooling system. The fan and heat exchanger assemblies 820*a*, 820*b* are coupled to the power module 434 and control module 432, which supplies power and control signals, respectively, to the fan and heat exchanger assemblies 820*a*, 820*b*.

Figure 9:
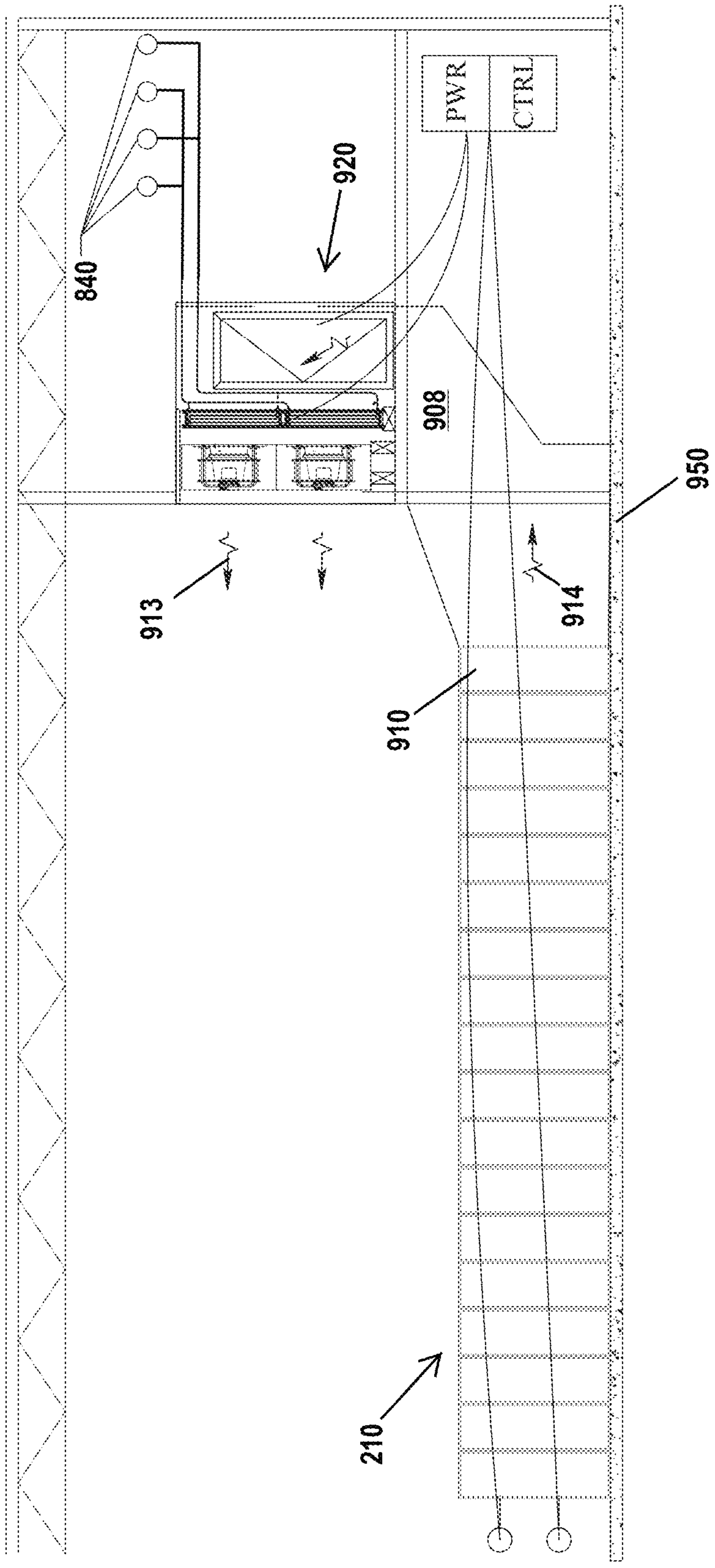
FIG. 9 is an elevation view of a data center assembly where the cooling modules are elevated above floor level according to yet another embodiment of this disclosure.

FIG. 9 shows another embodiment where the fan and heat exchanger assemblies 920 are elevated above the level of the floor 950. Warm return air is drawn from the hot aisles formed by the server racks 210 at the level of the floor 950, and cool supply air 913 is distributed from above, down to the front of the server racks 210. A containment assembly 908 is coupled to the right-most server racks 910 and to the underside of the fan and heat exchanger assemblies 920. In this configuration, the fans of the fan and heat exchanger assemblies draw warm air 914 from the hot aisles of the server racks 210 and through the containment assembly 908.

Figure 10:
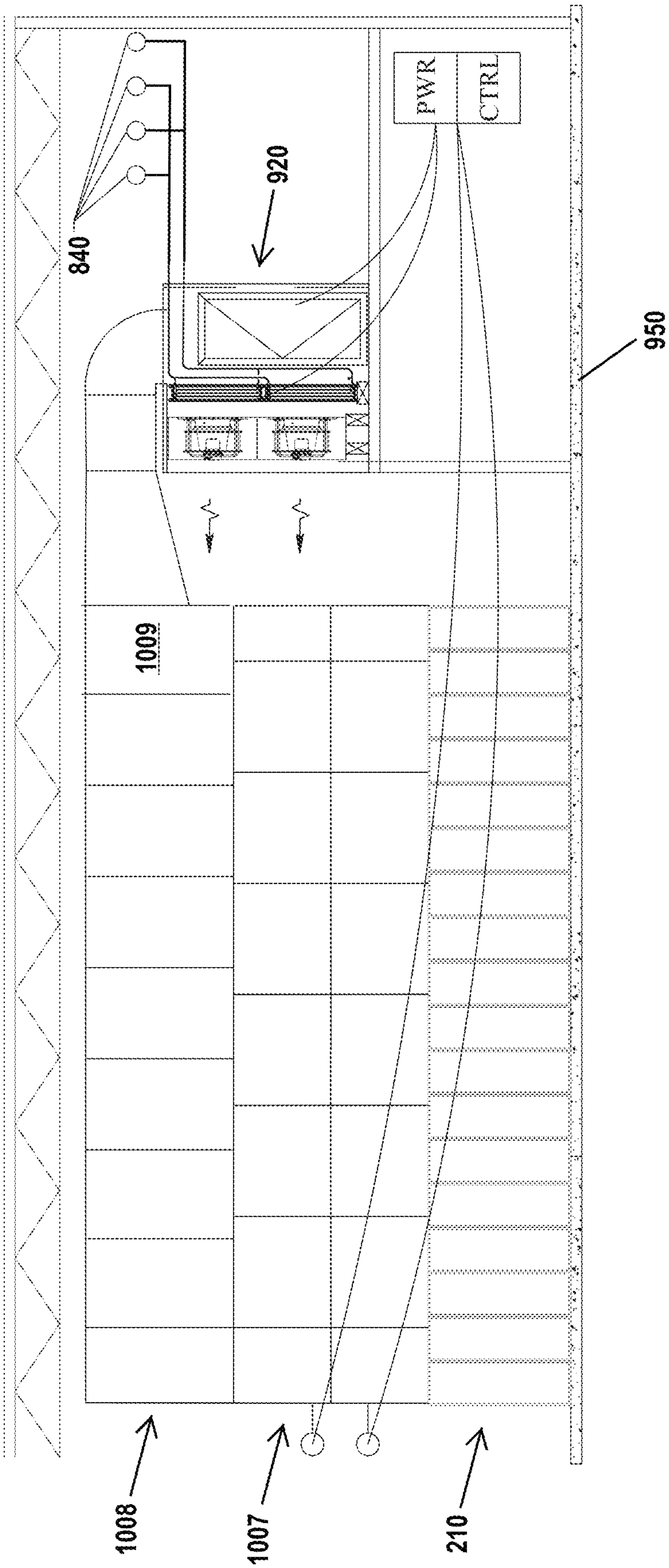
FIG. 10 is an elevation view of a data center assembly where the cooling modules or assemblies are elevated above floor level according to yet another embodiment of this disclosure.

FIG. 10 shows another embodiment of a cooling system where the fan and heat exchanger assemblies 920 are also elevated above the level of the floor 950. The cooling system includes a first air containment assembly 1007 and a second air containment assembly 1008 coupled to the top of the first air containment assembly 1007 and in air flow communication with the first air containment assembly 1007. The fan and heat exchanger assemblies 920 are coupled to the underside of the right-most portion 1009 of the second air containment assembly 1008 and are in air flow communication with the second air containment assembly 1008. The heat exchangers of the fan and heat exchanger assemblies 920 are coupled to chilled water supply and return piping, which carries cooling water from and return water to a water cooling system. The fans of the fan and heat exchanger module are coupled to the power and control module, which supplies power and control signals to the fans. Warm return air is drawn from the second air containment structure into an overhead plenum, and cool supply air is blown around the front of the server racks.

Figure 11:
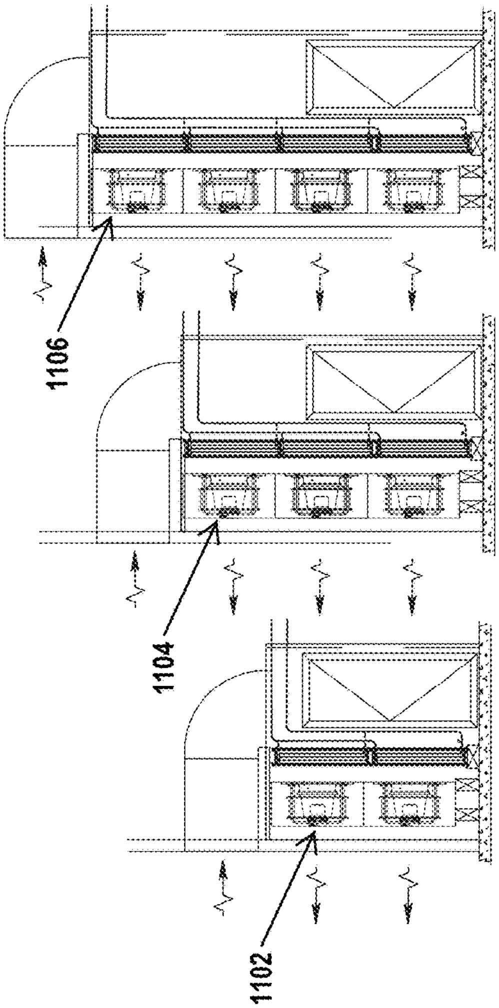
FIG. 11 is an elevation view of fan and heat exchanger assemblies having multiple fan and heat exchanger modules according to an embodiment of this disclosure.
Figure 12:
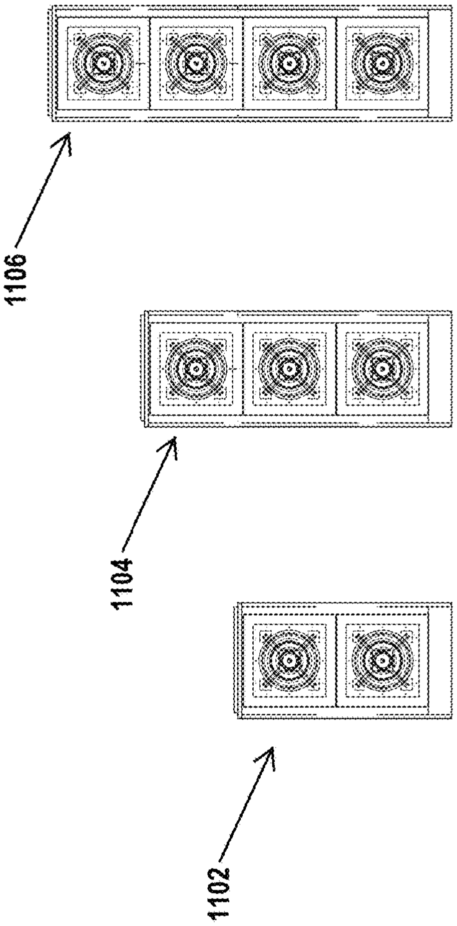
FIG. 12 is a front view of fan and heat exchanger assemblies having multiple fan and heat exchanger modules according to an embodiment of this disclosure.

FIGS. 11 and 12 are side and front views, respectively, showing examples of fan and heat exchanger modules or assemblies assembled to form larger fan and heat exchanger assemblies. In embodiments, two, three, or four fan and heat exchanger assemblies may be stacked to form stacked fan and heat exchanger assemblies 1102, 1104, and 1106, respectively. In embodiments, any number of the stacked fan and heat exchanger assemblies 1102, 1104, and 1106 may be connected side-by-side, e.g., six stacks may be connected side-by-side.

Figure 13:
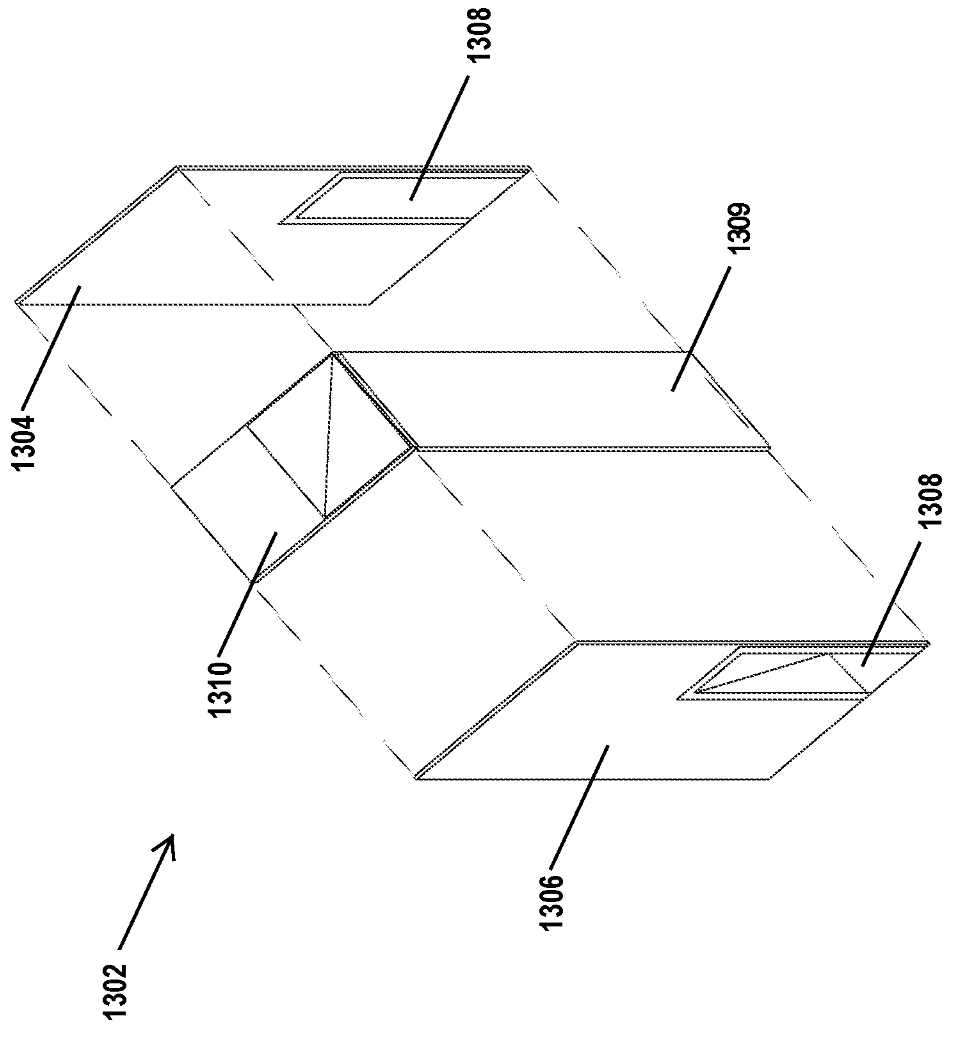
FIG. 13 is a perspective view of a "starter" enclosure assembly according to an embodiment of this disclosure.

FIG. 13 shows an example "starter enclosure assembly" 1302, which may be, for example, one fan and heat exchanger module wide and two fan and heat exchanger modules tall. The starter enclosure assembly 1302 includes a left wall panel 1304, a right wall panel 1306, a back wall panel 1309, and a roof panel 1310. The left wall panel 1304 and the right wall panel 1306 may include access doors 1308 for accessing the stacked fan and heat exchanger modules or assemblies.

Figure 14:
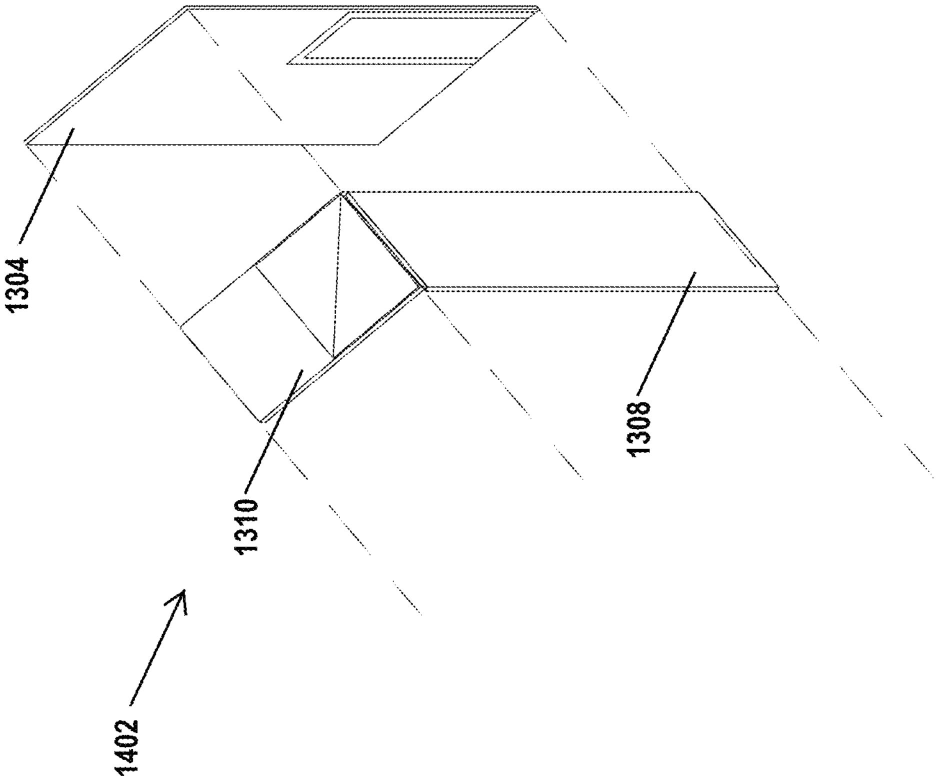
FIG. 14 is a perspective view of a "add-on" enclosure assembly according to an embodiment of this disclosure.

FIG. 14 shows an example "add-on enclosure assembly" 1402, which may be, for example, one fan and heat exchanger module wide and two fan and heat exchanger modules tall. The add-on enclosure assembly 1402 includes a left wall panel 1304, a back wall panel 1309, and a roof panel 1310, which may be appended to the starter enclosure assembly 1302 of FIG. 13.

Figure 15:
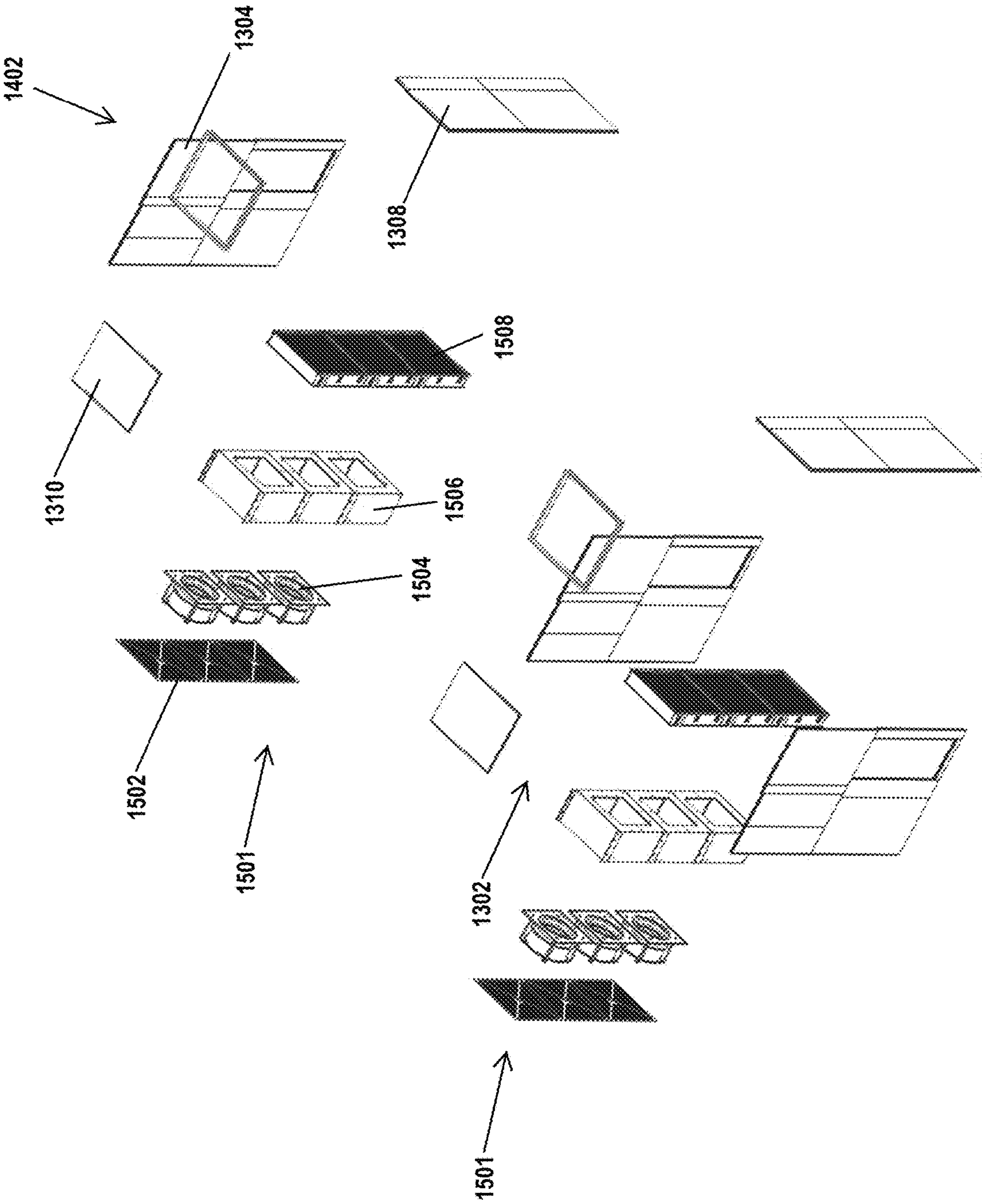
FIG. 15 is an exploded view of a fan and heat exchanger assembly according to an embodiment of this disclosure.

FIG. 15 is an exploded view illustrating the assembly of the starter assembly 1302, the add-on assembly 1402, and the stacked fan and heat exchanger modules or assemblies contained in the starter enclosure assembly 1302 and the add-on enclosure assembly 1402. The stacked fan and heat exchanger assemblies 1501 include fan guards 1502 (e.g., three fan guards), variable-speed fans 1504 (e.g., three variable-speed fans), fan housings 1506 (e.g., three fan housings configured to be coupled to each other), and heat exchangers 1508 (e.g., three heat exchangers configured to be coupled to each other). The enclosure assemblies 1302, 1402 and the stacked fan and heat exchanger assemblies 1501 may be shipped as partially-assembled kits. Then, final assembly may be done in the field.

Figure 16:
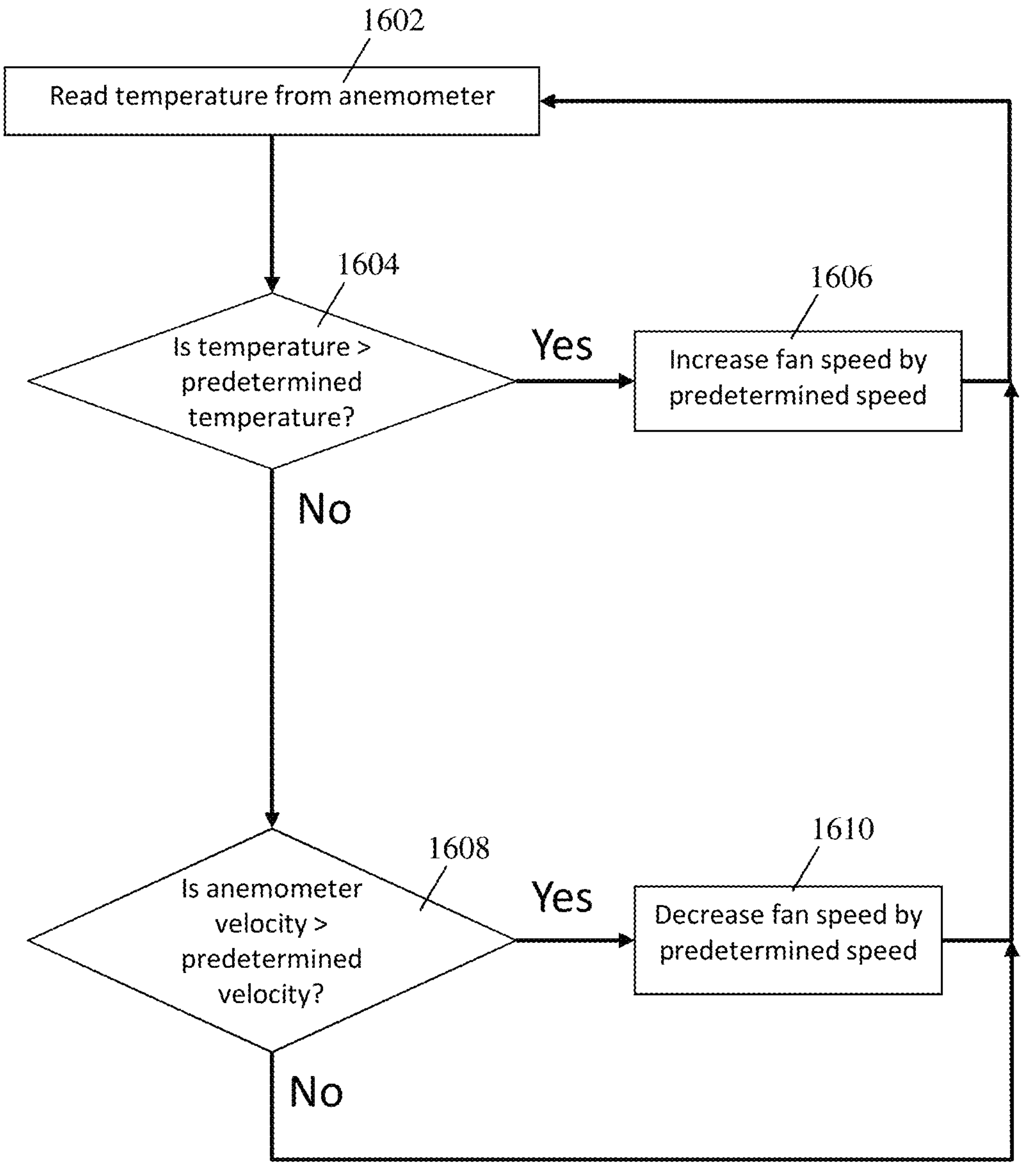
FIG. 16 is a flow diagram illustrating an example method of controlling a fan of a fan and heat exchanger assembly according to an embodiment of this disclosure.

The speed of the fans may be controlled to match server air flow by using a hot-wire anemometer to ensure a certain air flow rate out of the hot aisle containment area or assembly. FIG. 16 is a flow diagram illustrating an example method of controlling a fan of a fan and heat exchanger assembly according to embodiments. In block 1602, a temperature is read from the anemometer. Then, in block 1604 it is determined whether the temperature is greater than a predetermined temperature, e.g., 80° F. If the temperature is greater than the predetermined temperature, the fan speed is increased by a predetermined speed, e.g., 100 RPM, in block 1606.

If the temperature is not greater than the predetermined temperature, it is determined, in block 1608, whether the anemometer velocity is greater than a predetermined velocity, e.g., 150 ft/min. If the anemometer velocity is greater than the predetermined velocity, the fan speed is decreased by the predetermined speed or another predetermined speed, in block 1610. If the anemometer velocity is not greater than the predetermined velocity, the process returns to block 1602 to read the temperature from the anemometer.

Figure 17:
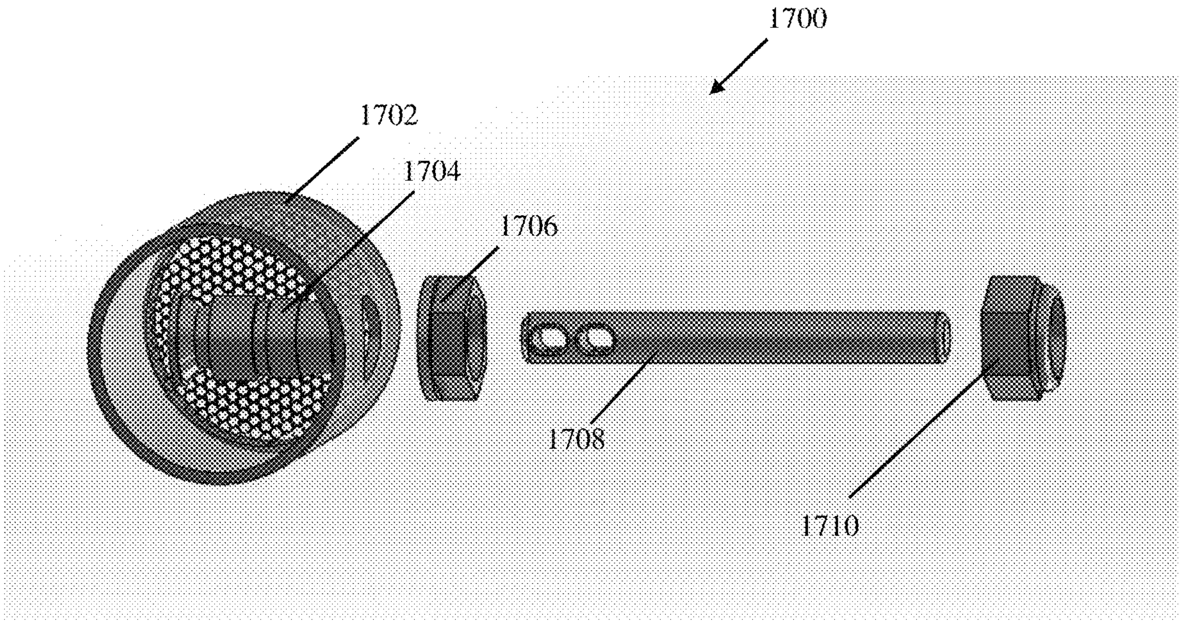
FIG. 17 is an exploded view of an anemometer module according to an embodiment of this disclosure.

FIG. 17 is an exploded view of an anemometer module 1700 used for measuring fluid velocity and fluid temperature according to an embodiment of this disclosure. The anemometer module 1700 includes an anemometer housing 1702, an anemometer retainer 1704, a housing nut retainer 1706, an anemometer 1708, and an anemometer nut retainer 1710. The anemometer retainer 1704 is secured to the anemometer housing 1702 with the housing nut retainer 1706. The anemometer 1708 is inserted into the anemometer retainer 1704 so that the two measurement windows of the anemometer 1708 are located at the center of the anemometer housing 1704 and are perpendicular to the fluid flow direction 1810 illustrated in FIG. 18. The anemometer 1708 is secured in place by the anemometer nut retainer 1710.

Figure 18:
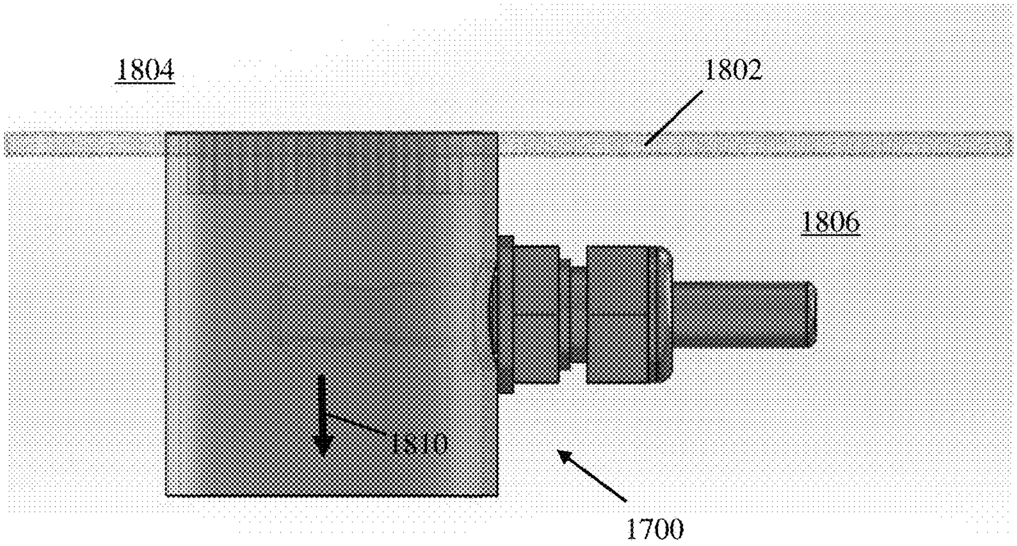
FIG. 18 is a side view of the anemometer module of FIG. 17 installed on a wall of a containment assembly.

As illustrated in FIG. 18, the anemometer module 1700 of FIG. 17 is installed at a cutout in the containment assembly wall 1802, which separates the hot aisle 1806 from the cold aisle 1804, so that the honeycomb side of the anemometer housing 1702 is flush with the containment assembly wall 1802. The honeycomb design helps straighten the fluid flow to reduce turbulence and thereby increase the accuracy of the anemometer.

Liquid (e.g., glycol and water) flow in the heat exchangers may be modulated to maintain the desired air discharge temperature. Aside from mechanical redundancy when more than one module is used, the entire system employs network redundancy for control by way of any suitable communications network.

Any suitable heat exchanger design may be used in embodiments of this disclosure including embodiments of the heat exchanger disclosed in International Application No. PCT/US2017/048969 titled "Cooling Systems and Methods Using Single-Phase Fluid and a Flat Tube Heat Exchanger with Counter-Flow Circuiting, filed on Aug. 28, 2017," the entire contents of which is incorporated by reference in its entirety.

Any suitable fluid cooler/chiller that provides any suitable fluid, such as a liquid, to heat exchangers may be used in the heat exchangers of the fan and heat exchanger assemblies according to embodiments of this disclosure including embodiments of the fluid cooler/chiller disclosed in U.S. patent application Ser. No. 15/697,445 titled "Cooling Systems and Methods Using Single-Phase Fluid," the entire contents of which is incorporated by reference herein. However, any suitable liquid, such as water or a water/glycol mixture, may be used.

Although embodiments of this disclosure have been described with reference to the accompanying drawings, it is to be noted that various changes and modifications will become apparent to those skilled in the art. Such changes and modifications are to be understood as being included within the scope of this disclosure as defined by the appended claims.

The invention claimed is:

1. A cooling system comprising:

a ceiling plenum;

a containment assembly disposed above at least one hot aisle formed by rows of server racks and configured to direct fluid from the hot aisle through an aperture in the ceiling plenum;

a fluid velocity sensor configured to measure velocity of fluid flowing in the hot aisle or the containment assembly;

a temperature sensor configured to measure a temperature of the fluid flowing in the hot aisle or the containment assembly, yielding a measured temperature;

at least two modular fan and heat exchanger assemblies, each modular fan and heat exchanger assembly including within an enclosure assembly a single fan and a single heat exchanger disposed directly adjacent to the single fan; and a controller configured to adjust a speed of at least one fan of the at least two modular fan and heat exchanger assemblies based on the measured temperature and velocity, wherein if a total IT load divided by a total number of active fan and heat exchanger assemblies is greater than a predetermined percentage, a measured temperature differential between inlet and discharge temperatures of the at least two modular fan and heat exchanger assemblies is greater than a predetermined temperature, and the measured temperature is greater than a temperature set point, the speed of the at least one fan is increased by a predetermined number of rotations per minute (RPM), wherein at least one fan of the at least two modular fan and heat exchanger assemblies cause fluid to flow from the ceiling plenum, through at least one heat exchanger of the at least two modular fan and heat exchanger assemblies, and to the server racks, wherein the at least two modular fan and heat exchanger assemblies are disposed inside an outdoor enclosure outside of a building housing the rows of server racks and directly adjacent to a wall of the building, wherein at least one fan of the at least two modular fan and heat exchanger assemblies is disposed between the wall and at least one heat exchanger of the at least two modular fan and heat exchanger assemblies, and wherein the at least two modular fan and heat exchanger assemblies cause fluid to flow through an aperture in the wall to the server racks.

2. The cooling system of claim 1, wherein the at least two modular fan and heat exchanger assemblies include a first row of fan and heat exchanger assemblies and a second row of fan and heat exchanger assemblies adjacent to the first row of the fan and heat exchanger assemblies.

3. The cooling system of claim 1, wherein the fluid velocity sensor and the temperature sensor are implemented by an anemometer.

4. The cooling system of claim 3, further comprising a redundant anemometer.

5. The cooling system of claim 1, wherein the enclosure assembly is a starter enclosure assembly.

6. The cooling system of claim 5, further comprising an add-on enclosure assembly.

7. The cooling system of claim 6, wherein the add-on enclosure assembly is coupled to the starter enclosure assembly.

8. A cooling system comprising:
- a ceiling plenum including an aperture;
- a containment assembly disposed above a hot aisle formed by rows of information technology (IT) racks and configured to direct fluid from the hot aisle into the ceiling plenum through the aperture;
- a fluid velocity sensor configured to measure velocity of fluid flowing in the hot aisle or the containment assembly;
- a temperature sensor configured to measure a temperature of the fluid flowing in the hot aisle or the containment assembly;
- modular fan and heat exchanger assemblies, each including a single fan and a single heat exchanger disposed directly adjacent to the single fan; and
- a controller configured to adjust a speed of fans of the modular fan and heat exchanger assemblies based on the temperature and velocity, wherein if a total IT load divided by a total number of active fan and heat exchanger assemblies is greater than a predetermined percentage, a measured temperature differential between inlet and discharge temperatures of the modular fan and heat exchanger assemblies is greater than a predetermined temperature, and the temperature is greater than a temperature set point, the speed of the fans is increased,
- wherein the modular fan and heat exchanger assemblies are disposed inside an enclosure outside of a building housing the IT racks and directly adjacent to a wall of the building, and
- wherein the fans of the modular fan and heat exchanger assemblies cause fluid to flow from the ceiling plenum, through heat exchangers of the modular fan and heat exchanger assemblies, through an aperture in the wall, and to the IT racks.

9. The cooling system of claim 8, wherein the modular fan and heat exchanger assemblies include a first row of fan and heat exchanger assemblies and a second row of fan and heat exchanger assemblies adjacent to the first row of fan and heat exchanger assemblies.

10. The cooling system of claim 8, wherein the fluid velocity sensor and the temperature sensor are implemented by an anemometer.

11. The cooling system of claim 10, further comprising a redundant anemometer.

12. The cooling system of claim 8, wherein the enclosure is a starter enclosure.

13. The cooling system of claim 12, further comprising an add-on enclosure.

14. The cooling system of claim 13, wherein the add-on enclosure is coupled to the starter enclosure.

15. A data center cooling system comprising:
- a ceiling plenum including an aperture;
- a containment assembly disposed above a hot aisle formed by rows of information technology (IT) cabinets and configured to direct fluid from the hot aisle through the aperture;
- fan and heat exchanger assemblies, each including a single fan and a single heat exchanger disposed directly adjacent to the single fan; and
- a controller configured to adjust a speed of fans of the fan and heat exchanger assemblies based on a temperature and a velocity of fluid flowing in the hot aisle or the containment assembly, the controller being responsive to temperature and velocity measurements obtained from an anemometer disposed in the containment assembly, wherein, when a measured temperature differential between an inlet temperature and a discharge temperature of the fan and heat exchanger assemblies is greater than a predetermined temperature differential and a temperature measured by the anemometer is greater than a temperature set point, the controller increases the speed of the fans,
- wherein the fan and heat exchanger assemblies are disposed directly adjacent to a wall of a building housing the IT cabinets,
- wherein the fans of the fan and heat exchanger assemblies cause fluid to flow from the ceiling plenum, through heat exchangers of the fan and heat exchanger assemblies, through an aperture in the wall, and to the IT cabinets, and
- wherein the fan and heat exchanger assemblies are modularly stackable in at least two vertical rows and horizontally connectable to expand capacity.

16. The data center cooling system of claim 15, wherein the fan and heat exchanger assemblies include a first row of fan and heat exchanger assemblies and a second row of fan and heat exchanger assemblies adjacent to the first row of fan and heat exchanger assemblies.

17. The data center cooling system of claim 15, wherein the fan and heat exchanger assemblies include three stacked fan and heat exchanger assemblies.

18. The data center cooling system of claim 15, wherein the controller is further configured to determine a temperature differential based on measurements from both a first temperature sensor located in the hot aisle and a second temperature sensor located downstream of a heat exchanger, and to adjust the speed of the fans in response to both temperature and air velocity values obtained from an anemometer disposed in the containment assembly.

19. The data center cooling system of claim 15, wherein the fan and heat exchanger assemblies are disposed inside an outdoor enclosure outside of the building housing the IT cabinets and directly adjacent to a wall of the building, and the outdoor enclosure is weather proofed and includes an aperture configured to channel air through the wall.

* * * * *